United States Patent
Kaya et al.

(10) Patent No.: US 8,304,809 B2
(45) Date of Patent: Nov. 6, 2012

(54) GAN-BASED SEMICONDUCTOR DEVICE AND METHOD OF MANUFACTURING THE SAME

(75) Inventors: Shusuke Kaya, Tokyo (JP); Seikoh Yoshida, Tokyo (JP); Masatoshi Ikeda, legal representative, Tokyo (JP); Sadahiro Kato, Tokyo (JP); Takehiko Nomura, Tokyo (JP); Nariaki Ikeda, Tokyo (JP); Masayuki Iwami, Tokyo (JP); Yoshihiro Sato, Tokyo (JP); Hiroshi Kambayashi, Tokyo (JP); Koh Li, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 388 days.

(21) Appl. No.: 12/292,164

(22) Filed: Nov. 13, 2008

(65) Prior Publication Data
US 2009/0140295 A1   Jun. 4, 2009

(30) Foreign Application Priority Data
Nov. 16, 2007  (JP) ................................ 2007-297732
Nov. 16, 2007  (JP) ................................ 2007-297733

(51) Int. Cl.
*H01L 29/737* (2006.01)
*H01L 21/28* (2006.01)
*H01L 21/265* (2006.01)

(52) U.S. Cl. ........................ 257/192; 257/615

(58) Field of Classification Search .......... 257/615, 257/E21.403, E21.407
See application file for complete search history.

(56) References Cited

U.S. PATENT DOCUMENTS

| 5,081,511 | A | * | 1/1992 | Tehrani et al. | 257/192 |
| 5,225,707 | A | * | 7/1993 | Komaru et al. | 257/513 |
| 5,329,154 | A | * | 7/1994 | Kishita et al. | 257/532 |
| 5,915,164 | A | * | 6/1999 | Taskar et al. | 438/47 |
| 5,977,565 | A | * | 11/1999 | Ishikawa et al. | 257/81 |
| 6,492,669 | B2 | * | 12/2002 | Nakayama et al. | 257/282 |
| 6,583,468 | B2 | * | 6/2003 | Hori et al. | 257/327 |
| 6,667,529 | B2 | * | 12/2003 | Takagi | 257/488 |
| 7,078,743 | B2 | * | 7/2006 | Murata et al. | 257/192 |
| 7,291,872 | B2 | * | 11/2007 | Hikita et al. | 257/192 |
| 7,339,207 | B2 | * | 3/2008 | Murata et al. | 257/192 |
| 7,439,555 | B2 | * | 10/2008 | Beach et al. | 257/194 |

(Continued)

FOREIGN PATENT DOCUMENTS
JP     05-021474        1/1993
JP     05021474 A   *  1/1993
(Continued)

*Primary Examiner* — Long Tran
*Assistant Examiner* — Jordan Klein
(74) *Attorney, Agent, or Firm* — Lowe, Hauptman, Ham & Berner, LLP

(57) ABSTRACT

In a GaN-based semiconductor device, an active layer of a GaN-based semiconductor is formed on a silicon substrate. A trench is formed in the active layer and extends from a top surface of the active layer to a depth reaching the silicon substrate. A first electrode is formed on an internal wall surface of the trench and extends from the top surface of the active layer to the silicon substrate. A second electrode is formed on the active layer to define a current path between the first electrode and the second electrode via the active layer in an on-state of the device. A bottom electrode is formed on a bottom surface of the silicon substrate and defines a bonding pad for the first electrode. The first electrode is formed of metal in direct ohmic contact with both the silicon substrate and the active layer.

20 Claims, 10 Drawing Sheets

U.S. PATENT DOCUMENTS

| | | | |
|---|---|---|---|
| 7,612,426 B2 * | 11/2009 | Yanagihara et al. | 257/472 |
| 2006/0108659 A1 * | 5/2006 | Yanagihara et al. | 257/471 |
| 2008/0073752 A1 * | 3/2008 | Asai et al. | 257/615 |
| 2008/0105885 A1 * | 5/2008 | Watanabe et al. | 257/96 |

FOREIGN PATENT DOCUMENTS

| | | |
|---|---|---|
| JP | 2004-363563 | 12/2004 |
| JP | 2006-086398 | 3/2006 |
| JP | 2006-173582 | 6/2006 |

* cited by examiner

PRIOR ART

GAN-BASED SEMICONDUCTOR DEVICE AND METHOD OF MANUFACTURING THE SAME

CROSS-REFERENCE TO RELATED APPLICATIONS

This application claims priority from a Japanese patent application serial No. 2007-297732 filed on Nov. 16, 2007 and a Japanese patent application serial No. 2007-297733 filed on Nov. 16, 2007, the entire contents of which are incorporated herein by reference.

BACKGROUND OF THE INVENTION

1. Field of the Invention

The present invention relates to a GaN-based semiconductor device such as a GaN-based hetero-junction field effect transistor (HFET) or the like and a method of manufacturing the GaN-based semiconductor device.

2. Description of the Related Art

Patent Reference 1 has disclosed a conventional GaAs-FET. FIG. 10 shows the GaAs-FET disclosed in Patent Reference 1. The GaAs-FET has a source electrode (a first conductor) 2, a drain electrode 4, and a gate electrode 3 on a surface of a GaAs semiconductor substrate 1, and a bottom electrode (a second conductor) 7 on a bottom surface of the semiconductor substrate 1. The GaAs-FET is provided with a via hole 8 connecting the source electrode 2 and the bottom electrode 7 in the semiconductor substrate 1. The via hole 8 is filled with a third conductor. The GaAs-FET has an insulating film 6 formed between the third conductor in the via hole 8 and the semiconductor substrate 1.

Generally, in the FET of a planar type, three bonding pads are required for three electrodes, thereby increasing a size of an element. Therefore, in the GaAs-FET shown in FIG. 10, the via hole 8 is formed from a bottom surface of the substrate 1, so that the bottom electrode 7 and the source electrode 2 are electrically connected, thereby reducing one of the three bonding pads. Further, in order to prevent a breakdown voltage from lowering, a portion of the via hole 8 is covered with the insulating film 6.

As opposed to the GaAs-based material, the GaN-based semiconductor material has a larger bandgap energy and high heat resistance capable of operating at a high temperature. Accordingly, a field effect transistor or the like using the GaN-based material has been developed.

Patent Reference 2 has disclosed a GaN-based HEMT (High Electron Mobility Transistor) formed of a gallium nitride type semiconductor compound as a GaN-based semiconductor device. In the GaN-based HEMT, a buffer layer is formed on a substrate if needed, and a carrier drift layer and a carrier supplying layer epitaxially grown thereon. Further, an electrode is formed thereon.

In the semiconductor device of the planar type, it is possible to obtain a large electric power with a small area. However, a current density flowing in a wiring portion tends to be large, and electro-migration (or a disconnection of the wiring portion) tends to occur. In the planar device (or planar power device), an electrode is often formed in a comb shape. Accordingly, the current density may exceed $2 \times 10^6$ A/cm², there by making it difficult to obtain sufficient resistant to the electro-migration (EM) with an electrode formed of Au or Al. In order to solve the problem, it is necessary to provide a structure for reducing the current density.

To this end, a thickness of an electrode increases for reducing the current density, or a portion of a source electrode is grooved for flowing a current vertically. In order to sufficiently reduce the current density, however, it is necessary to increase the thickness of the electrodes up to 20 μm while the electrode has a width of 10 μm, thereby increasing a height of the electrode. When the electrode has an excessive height, the electrode may be broken upon resin molding. Further, the electrode may be disconnected or a passivation film is cracked due to a thermal stress or the like. When the portion of the source electrode is grooved, it is possible to drastically reduce the current density less than 1 kA/cm². Patent References 3 and 4 have disclosed technologies for flowing a current vertically.

Patent Reference 1: Japanese patent publication No. H05-021474
Patent Reference 2: Japanese patent publication No. 2006-173582
Patent Reference 3: Japanese patent publication No. 2006-086398
Patent Reference 4: Japanese patent publication No. 2004-363563

In the conventional GaN-based semiconductor device disclosed in Patent Reference 1, an active layer formed of the GaN-based semiconductor is formed on a silicon (Si) substrate to form an epitaxial wafer having a large distortion. In order to restrain warping or crack, it is necessary to increase a thickness of the substrate greater than 500 μm. Accordingly, it is very difficult to form a via hole from a bottom side of the substrate.

Even when the via hole is formed from the bottom side of the substrate, the via hole has a depth greater than 500 μm as opposed to a width of 10 μm. Accordingly, it is difficult to form an insulating film between a conductor in the via hole and the semiconductor substrate deeply enough into the via hole.

In the semiconductor device disclosed in Patent Reference 3, a first source electrode and a second source electrode are formed separately from a via hole metal in ohmic contact with a conductive substrate, thereby making a manufacturing process complicated and costly. In addition, it is difficult to form a via hole metal only in a bottom surface of a trench.

In the semiconductor device disclosed in Patent Reference 4, a source electrode and a via hole metal in ohmic contact with a conductive substrate are formed integrally. The source electrode is formed of a metal in ohmic contact with the conductive substrate and in Schottky contact with a first semiconductor layer and a second semiconductor layer, thereby increasing an on-resistance thereof.

An object of the present invention is to solve the problems in the conventional technologies.

SUMMARY OF THE INVENTION

According to a first aspect of the present invention, a GaN-based semiconductor device comprises: a silicon substrate; an active layer of a GaN-based semiconductor formed on the silicon substrate; a trench formed in the active layer, the trench extending from a top surface of the active layer to a depth reaching the silicon substrate; a first electrode formed on an internal wall surface of the trench, the first electrode extending from the top surface of the active layer to the silicon substrate, the first electrode being formed of the metal in direct ohmic contact with both the silicon substrate and the active layer; a second electrode formed on the active layer to define a current path between the first electrode and the second electrode via the active layer in an on-state of the device;

and a bottom electrode formed on a bottom surface of the silicon substrate, the bottom electrode defining a bonding pad for the first electrode.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Figure 1:
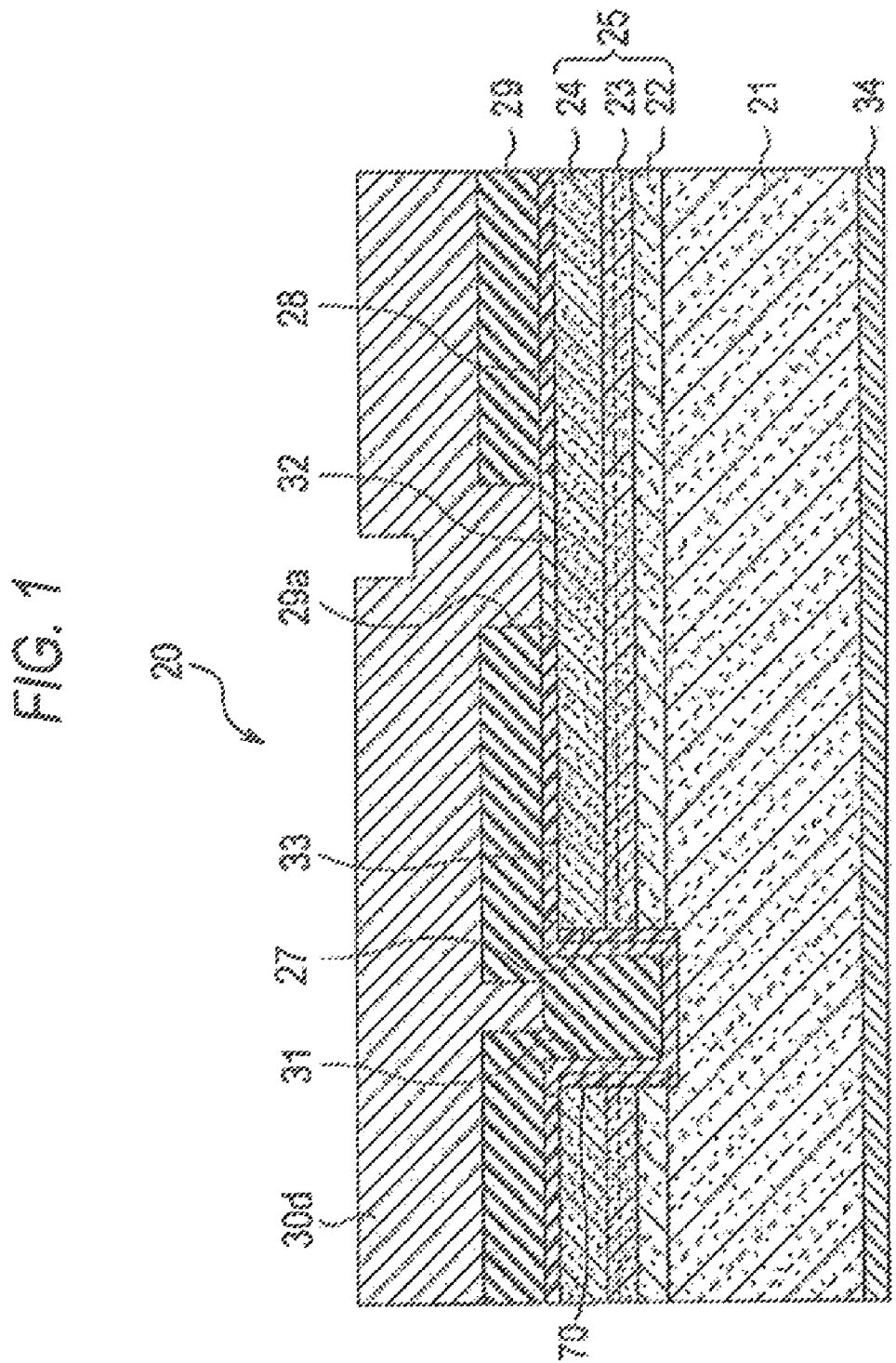
FIG. 1 is a cross sectional view showing a GaN-based semiconductor device according to a first embodiment of the present invention.

Hereunder, embodiments of the present invention will be explained below with reference to the accompanying drawings. In the following description, similar components are designated with the same reference numerals, and explanations thereof are omitted.

First Embodiment

A GaN-based semiconductor device 20 according to a first embodiment is explained below with reference to FIG. 1. The GaN-based semiconductor device 20 is configured as a GaN-based hetero-junction field effect transistor (GaN-based HEMT, or GaN-based HFET).

The GaN-based semiconductor device 20 has a p-type silicon (Si) substrate 21 doped with a p-type impurity, a buffer layer 22 formed on the substrate, a channel layer (carrier drift layer) 23 of undoped GaN layer formed on the buffer layer 22, and a carrier supplying layer 24 of undoped AlGaN formed on the channel layer 23. The buffer layer 22 is a lamination structure of AlN and GaN. The buffer layer 22, the channel layer (carrier drift layer) 23 (or a first GaN-based semiconductor layer) and the carrier supplying layer 24 (or a second GaN-based semiconductor layer) constitute an active layer 25.

Further, the GaN-based semiconductor device 20 has a gate electrode (G) 33, a source electrode (S) 31 as a first electrode and a drain electrode (D) 32 as a second electrode between which a current flows via the active layer 25 in the state of the gate electrode (G) 33 being forwardly biased (on-state), and a bottom electrode 34 formed on a bottom surface of the silicon substrate 21.

In the GaN-based semiconductor device 20, a carrier supplying layer (undoped AlGaN layer) 24 is in hetero-junction with the channel layer (undoped GaN layer) 23, and a band-gap energy of the carrier supplying layer 24 formed of undoped AlGaN is larger than that of the carrier drift layer (channel layer) 23. Therefore, a two-dimensional electron gas 26 is generated at the hetero-junction interface. Accordingly, the channel layer 23 has a high conductivity with the two-dimensional electron gas 26 working as carriers.

Further, in the GaN-based semiconductor device 20, a trench 27 is formed from a top surface of the active layer 25 to a depth reaching to the silicon substrate 21 at a portion of the active layer 25 in which the source electrode 31 is to be formed. A wall surface of the trench 27 is perpendicular to a lamination plane of the active layer 25.

The source electrode 31 which electrically connects the top surface of the active layer 25 and the silicon substrate 21, and an insulating layer 70 which insulate a portion of the source electrode 31 on an internal wall surface of the trench 27 from the active layer 25, are formed in the trench 27.

The source electrode 31 is formed on the internal wall surface of the trench 27 which is formed from the top surface of the active layer 25 (the top surface of the carrier supplying layer 24) to a depth reaching to the silicon substrate 21, with a predetermined thickness mentioned later.

The source electrode 31 is formed of a metal which is in ohmic contact with both the silicon substrate 21 and the active layer 25. For example, the source electrode 31 is a lamination of a Ti layer which is in contact with the active layer 25 and the silicon substrate 21 and a layer of alloy of Al and Si formed on the Ti layer. The drain electrode 32 also is a lamination of a Ti layer which is in contact with the carrier supplying layer 24 and a layer of alloy of Al and Si formed on the Ti layer. The gate electrode 33 is a lamination of, for example, Ni and Au.

On the top surface of the carrier supplying layer 24 among the source electrode 31, the gate electrode 33 and the drain electrode 32, a passivation film 28 is formed. On the passivation film 28 is formed an insulating film 29 formed of silicon nitride (SiN) so as to fill the trench of the source electrode 31. The drain electrode 32 is electrically connected to a pad electrode (a drain pad) 30d which is formed on a part of the insulating film 29 formed on the active layer 25 and which extends inside a through hole 29a of the insulating film 29.

Figure 2:
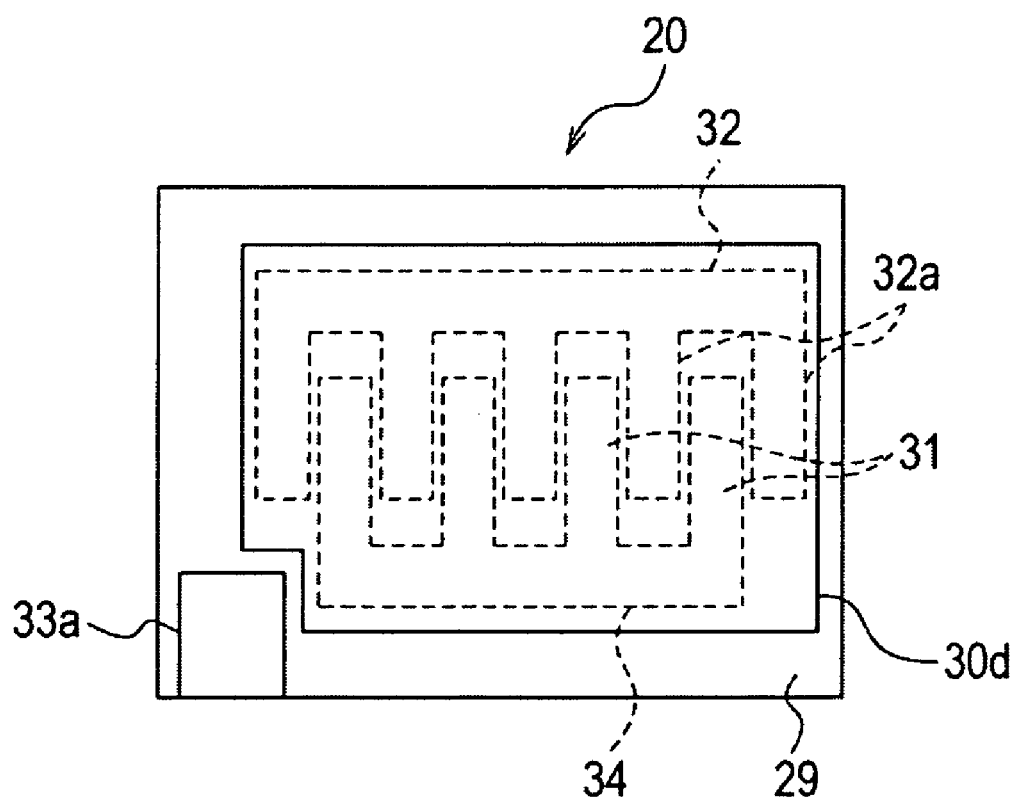
FIG. 2 is a plan view showing a top surface of the GaN-based semiconductor device according to the first embodiment of the present invention.

FIG. 2 is a plan view showing a top surface of the GaN-based semiconductor device 20. As shown in FIG. 2, on the insulating film 29, the pad electrode 30d and a gate pad 33a is formed. The pad electrode 30d is electrically connected to a plurality of teeth 32a of the comb-shaped drain electrode 32 via a conducting portion which extends inside the through hole 29a. Thus, the pad electrode 30d connects the teeth 32a of the comb-shaped drain electrode 32, thereby reducing a current density. On the other hand, the source electrode 31 (a plurality of teeth of the comb-shaped source electrode) shown in FIG. 1 and FIG. 2 is electrically connected to the bottom electrode 34 formed on the bottom surface of the p-type silicon substrate 21. The gate pad 33a is electrically connected to the gate electrode 33 shown in FIG. 1.

Figure 3:
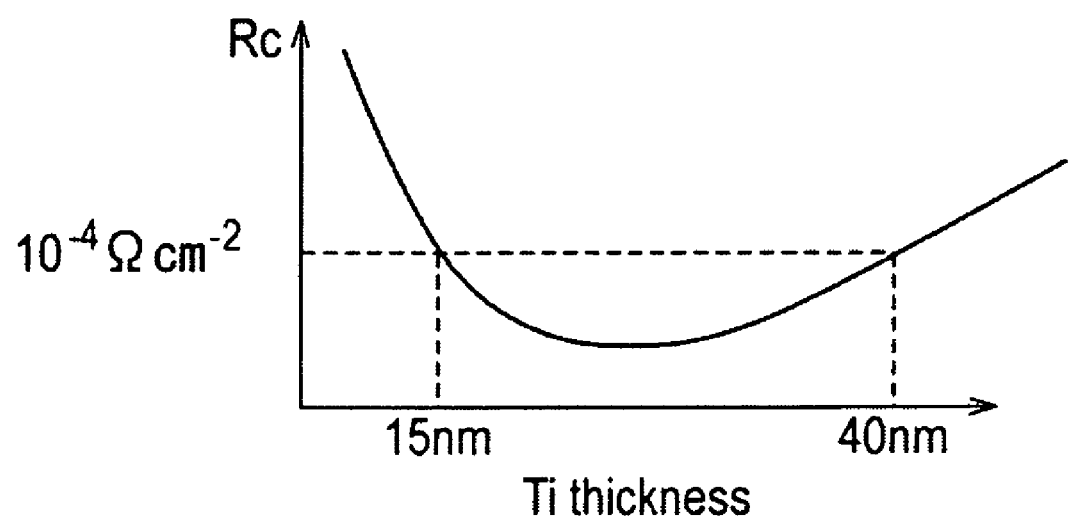
FIG. 3 is a graph showing a relationship between a film thickness of a Ti layer and a contact resistance with an active layer according to the first embodiment of the present invention.

As shown in FIG. 3, a thickness of the Ti layer of the source electrode 31 is preferably between 15 nm and 40 nm in order to obtain a good ohmic contact with the channel layer 23 of the active layer 25. When the thickness of the Ti layer is less than 15 nm or greater than 40 nm, a contact resistance (Rc) between the source electrode 31 and the p-type silicon substrate 21 exceeds, for example, $10^{-4}$ $\Omega cm^2$.

A p-type impurity concentration of the p-type silicon substrate 21 is preferably not less than $5\times10^{19}$ $cm^{-3}$ and not greater than $1\times10^{21}$ $cm^{-3}$. When the p-type impurity concentration of the p-type silicon substrate 21 is less than $5\times10^{19}$ $cm^{-3}$, the contact resistance (Rc) becomes large. When the p-type impurity concentration is greater than $1\times10^{21}$ $cm^{-3}$, a crystal quality of the buffer layer 22, the channel layer 23 and the carrier supplying layer 24 (the active layer 25) deteriorates.

Figure 4A:
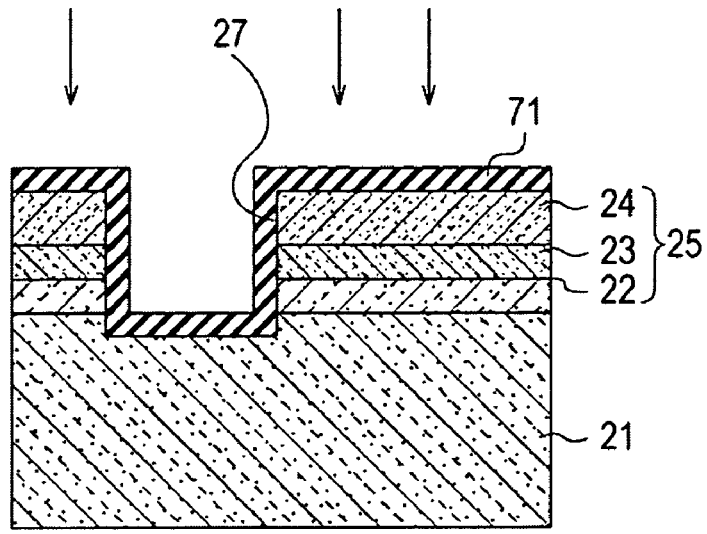
FIGS. 4 (A) to 4(C) are explanatory diagrams of a manufacturing process of the GaN-based semiconductor device according to the first embodiment of the present invention.

The above-configured GaN-based semiconductor device 20 can be manufactured as follows. A manufacturing method of the GaN-based semiconductor device 20, in which the insulating layer 70 is formed of an insulating film, is explained herein with reference to FIGS. 4A to 4C.

(1) First, a p-type silicon substrate 21 is introduced into a MOCVD (Metal Organic Chemical Vapor Deposition) apparatus. A growth chamber of the MOCVD apparatus is evacuated to $1\times10^{-6}$ hPa by a turbo-pump. Thereafter, a pressure in the growth chamber is raised to 100 hPa and a temperature of the silicon substrate 21 is increased to 600 degree C. After the temperature is stabilized, the silicon substrate 21 is rotated at 900 rpm, and a trimethylaluminium (TMA) or trimethylgallium (TMG) and ammonia are introduced onto the silicon substrate 21 with flow rates of 100 $cm^3$/min or 200 $cm^3$/min and 12 liter/min, respectively, to grow a buffer layer 22 constituted by a lamination structure of AlN and GaN. A growth duration time is 4 minutes, and a thickness of the buffer layer is about 50 nm.

(2) Then, while the ammonia is flown with a flow rate of 12 liter/min, the temperature is increased to 1,050 degree C. Trimethylgallium (TMG) and ammonia are introduced onto the buffer layer 22 with flow rates of 300 $cm^3$/min and 12 liter/min, respectively, to grow a channel layer (a carrier drift layer) 23 of GaN. A growth duration time is 2000 seconds, and a thickness of the channel layer 23 is 3000 nm.

(3) Thereafter, trimethylaluminium (TMA), trimethylgallium (TMG) and ammonia are introduced with flow rates of 50 $cm^3$/min, 100 $cm^3$/min, and 12 liter/min, respectively, to grow a carrier supplying layer 24 of $Al_{0.25}Ga_{0.75}N$. A growth duration time is 40 seconds, and a thickness of the carrier supplying layer 24 is 20 nm. Thus, a lamination structure of semiconductor shown in FIG. 1 is obtained.

(4) Then, isolation mesas are formed by dry-etching using $Cl_2$ etc.

(5) Thereafter, a photoresist is overlaid, and patterning is performed to form an opening in a portion at which a drain electrode 32 is to be formed. The drain electrode 32 of Ti film and an alloy film of Al and Si is formed by lift-off method using the patterned photoresist as a mask.

(6) Then, the photoresist is removed and a $SiO_2$ insulating film is formed. The $SiO_2$ insulating film is patterned to form an opening in a portion where a source electrode 31 is to be formed. In the opening, the active layer 25 is removed by etching from its top surface to a depth reaching to the silicon substrate 21. Thus, a trench 27 having a wall perpendicular to the lamination plane is formed.

(7) After forming the trench 27, the $SiO_2$ insulating film is removed. Then, an insulating film ($SiO_2$) 71 is formed on the entire surface. (See FIG. 4A).

Figure 4B:
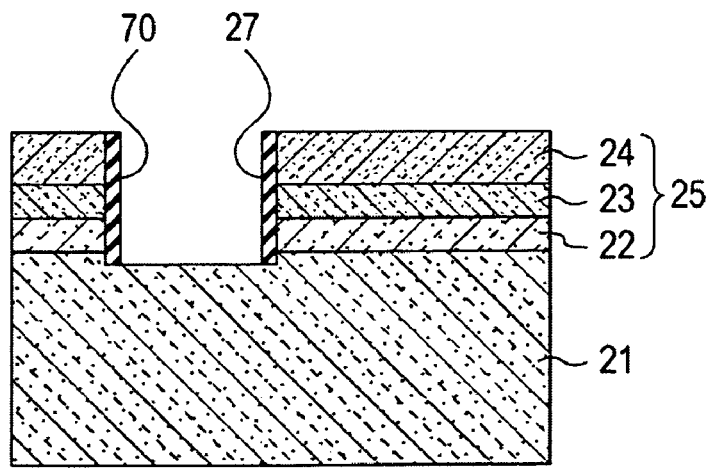
Figure 4C:
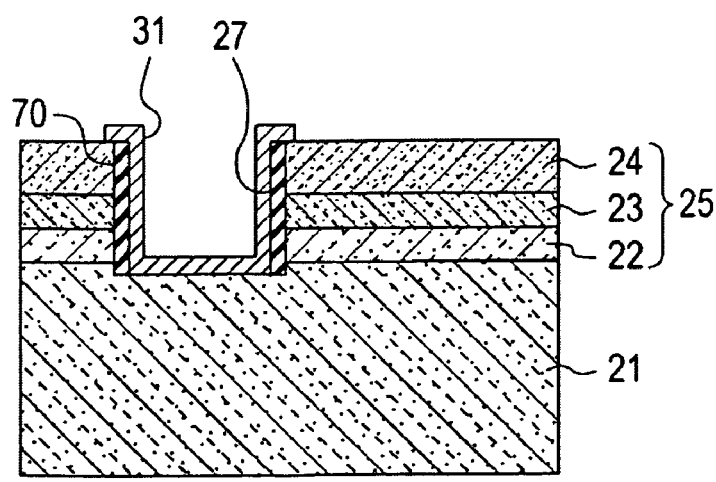

(8) The insulating film 71 is etched overall (anisotropic overall etching) using RIE (Reactive Ion Etching), leaving an insulating film only on an internal wall surface of the trench 27 (see FIG. 4B). Thus, an insulating layer 70 constituted by the insulating film is formed on the internal wall surface of the trench 27.

(9) Then, a photoresist is overlaid, and patterning is performed to form an opening in a portion where a source electrode 31 is to be formed. Using the patterned photoresist as a mask, the source electrode 31 of a Ti film and an alloy film of Al and Si is formed by lift-off method, on an in internal wall surface of the insulating layer 70 and on a top surface of the active layer 25 (see FIG. 4C). Here, the Ti film and the alloy film of Al and Si are sequentially evaporated, to form the source electrode 31 of a lamination structure having the Ti layer, which is in contact with the silicon substrate 21 and the active layer 25, and the layer of the alloy of Al and Si, on an entire internal wall surface of the insulating layer 70, with the above-mentioned thickness, to a depth reaching the silicon substrate 21. Thus, the source electrode 31 electrically connects the top surface of the active layer 25 and the silicon substrate 21. But the source electrode 31 is not in electrical contact with the active layer 25 at the internal wall surface of the trench 27 due to the intervention of the insulating layer 70.

(10) Then, the photoresist is removed and a passivation film 28 is formed on the top surface of carrier supplying layer 24.

(11) Subsequently, an opening is formed in a portion of the passivation film 28 where a gate electrode 33 is to be formed. Thereafter, the gate electrode 33 is formed by evaporating Ni and Au in the opening.

(12) Then, an insulating film 29 of silicon nitride (SiN) is deposited on the passivation film 28 so as to fill the trench 27 of the source electrode 31.

(13) Then, a through hole 29a is formed in a portion of the insulating film 29 corresponding to the drain electrode 32. A drain pad (a pad) 30d is formed on a part of a top surface of the insulating film 29 and inside the through hole 29a so as to be electrically connected to the drain electrode 32.

(14) Finally, a bottom electrode 34 is formed on a bottom surface of the silicon substrate 21.

Thus, the GaN-based semiconductor device (the GaN-based HEMT) 20 shown in FIG. 1 is completed.

In the GaN-based semiconductor device 20, in the state of the gate electrode (G) 33 being forwardly biased (on-state), a current flows from the drain electrode 32 to the source electrode 31 via the channel layer (the carrier drift layer) 23 of the active layer 25, and further flows in the source electrode 31 in the vertical direction, to the bottom electrode 34 via the p-type silicon substrate.

According to the first embodiment configured as described above, following effects are obtained.

(A) The source electrode 31 electrically connects the top surface of the active layer 25 and the silicon substrate 21. Accordingly, the source electrode 31 is electrically connected to the bottom electrode 34 via the silicon substrate 21, and the entire bottom electrode 34 serves as a bonding pad of the source electrode 31. Thus, a bonding pad for the source electrode 31 becomes unnecessary and the number of bonding pads is reduced, whereby the size of the device (an area of the chip) is reduced.

(B) The portion of the source electrode 31 on the internal wall surface of the trench 27 is not in electrical contact with the active layer 25 due to the intervention of the insulating layer 70. Accordingly, the avalanche breakdown due to electron injection from the source electrode 31 in the trench 27 into the active layer 25 is restrained.

In the above-configured GaN-based semiconductor device 20, the insulating layer 70 formed of an insulating film may be replaced with an insulating layer 70A, which is constituted by an ion-implanted layer formed to have a high resistance by ion-implanting the active layer 25.

A manufacturing method of the GaN-based semiconductor device 20, in which the insulating layer 70A is formed of an ion-implanted layer, is explained below with reference to FIGS. 5A-5C.

After the step (5), the following steps (6') to (8') are performed in place of the steps (6) to (9).

Figure 5A:
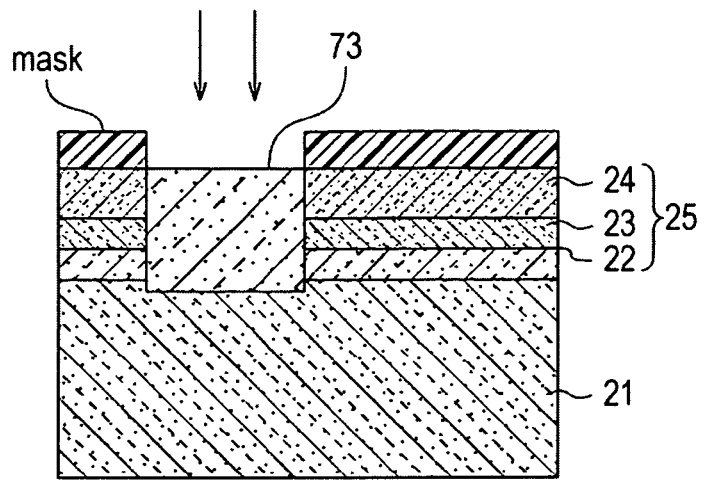
FIGS. 5 (A) to 5(C) are explanatory diagrams of another manufacturing process of the GaN-based semiconductor device according to the first embodiment of the present invention.

(6') An ion-implanted portion 73, into which ions are selectively implanted to have a higher resistance, is formed in the opening in which the source electrode 31 is to be formed (See FIG. 5A).

Figure 5B:
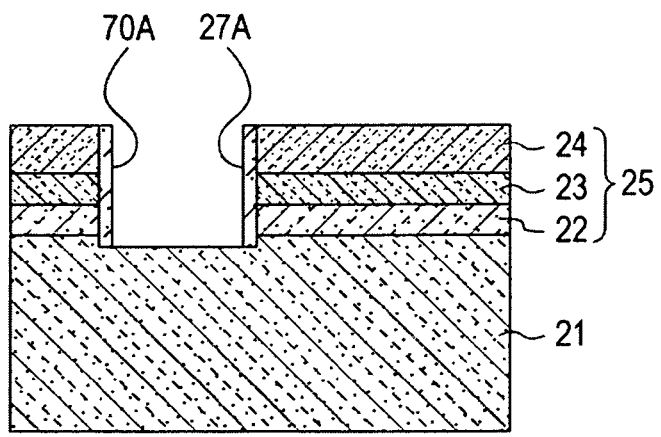
Figure 5C:
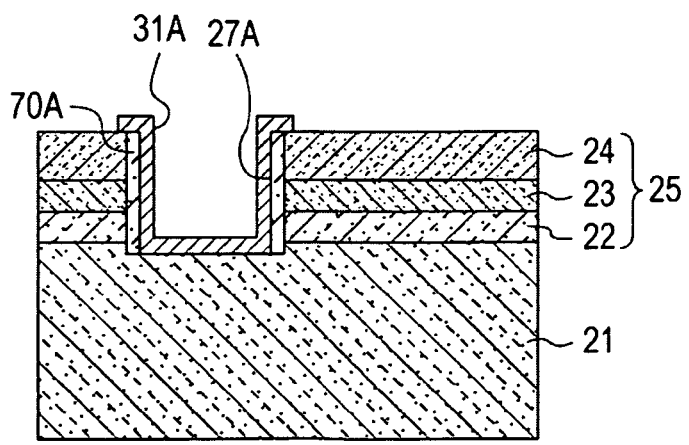

(7') Then, the ion-implanted portion 73 is etched to a depth reaching to the silicon substrate 21 so as to leave the ion-implanted portion 73 only on the internal wall surface of the trench 27A (i.e., the interface between the ion-implanted portion 73 and the active layer 25) thereby to form an insulating layer 70A (See FIG. 5B). Thus, the ion-implanted portion 73 is left only on the internal wall surface of the trench 27A, and the insulating layer 70A constituted by the ion-implanted layer having a higher resistance is formed. The internal wall surface of a trench 27A in this configuration corresponds to an interface between the ion-implanted portion 73 formed in the step (6') and the active layer 25.

(8') Then, a photoresist is overlaid, and patterning is performed to form an opening in a portion where a source electrode 31A is to be formed. Using the patterned photoresist as a mask, the source electrode 31A of a Ti film and an alloy film of Al and Si is formed by lift-off method, on an internal wall surface of the insulating layer 70A and on a top surface of the active layer 25 (See FIG. 5C).

Here, the Ti film and the alloy film of Al and Si are sequentially evaporated, to form the source electrode 31A of a lamination structure having the Ti layer, which is in contact with the silicon substrate 21 and the active layer 25, and the layer of the alloy of Al and Si, on an entire internal wall surface of the insulating layer 70A, with the above-mentioned thickness, to a depth reaching the silicon substrate 21. Thus, the source electrode 31A is formed in the trench 27A. The source electrode 31A electrically connects the top surface of the active layer 25 and the silicon substrate 21. But the source electrode 31A is not in electrical contact with the active layer 25 at the internal wall surface of the trench 27A due to the intervention of the insulating layer 70A.

Thereafter, the steps (10) to (14) are performed. Thus, the GaN-based semiconductor device 20, in which the insulating layer 70A is formed of an ion-implanted layer, is completed.

Second Embodiment

Next, a GaN-based semiconductor device 20A according to a second embodiment is explained with reference to FIG. 6.

In the GaN-based semiconductor device 20A, the trench 27 of the GaN-based semiconductor device 20 of the first embodiment is replaced with a trench 27B of an inverted trapezoid in cross section, with an internal wall surface of the trench 27B being inclined.

In the GaN-based semiconductor device 20A, the trench 27B is formed in a portion of the active layer 25 where the source electrode 31A is to be formed from the top surface of the active layer 25 to a depth reaching to the silicon substrate 21. In the trench 27B, the source electrode 31A which electrically connects the top surface of the active layer 25 and the silicon substrate 21 and an insulating layer 70 which insulates a portion of the source electrode 31A on an internal wall surface of the trench 27B from the active layer 25 are formed. Other configuration of the device is similar to that of the first embodiment.

According to the second embodiment thus configured, effects similar to those of the first embodiment are obtained.

Third Embodiment

A GaN-based semiconductor device 20C according to a third embodiment is explained with reference to FIG. 7.

The GaN-based semiconductor device 20C is configured as a GaN-based MOS field effect transistor (GaN-based MOSFET).

The GaN-based semiconductor device 20C is a MOS field effect transistor having a p-type silicon substrate 21, an epitaxial layer (an active layer) 41 of GaN-based semiconductor formed on the substrate, a source electrode 42, a drain electrode 44, a gate oxide film 45 formed on the epitaxial layer 41, and a gate electrode 43 formed on the gate oxide film 45.

In the GaN-based semiconductor device 20C, a trench 27D is formed in a portion of the epitaxial layer 41 working as an active layer, where the source electrode 42 is to be formed, from a top surface of the epitaxial layer 41 to a depth reaching to the silicon substrate 21. In the trench 27D, the source electrode 42 which electrically connects the top surface of the epitaxial layer 41 and the silicon substrate 21 and an insulating layer 70 which insulates a portion of the source electrode 42 on an internal wall surface of the trench 27D from the epitaxial layer 41 are formed.

Further, the GaN-based semiconductor device 20C has impurity doped layers underneath the ohmic electrodes (the source electrode 42 and the drain electrode 44), which are formed by regrowth technique or ion-implant technique. The GaN-based semiconductor device 20C has, as the impurity doped layers, ohmic contact layers 46a, 46b formed underneath the source electrode 42 on the top surface of the epitaxial layer 41 (more specifically, underneath both the lateral upper-end portions 42a, 42b of the source electrode 42), an ohmic contact layer 47 formed underneath the drain electrode 44, and a resurf layer 48 provided for the purpose of relieving electric field concentration.

The epitaxial layer 41 is a p-GaN layer formed by epitaxilly growing GaN doped with a predetermined dose of Mg on the silicon substrate 21 using MOCVD method.

The ohmic contact layers 46a, 46b and 47 are n+-GaN layers formed by ion-implanting silicon (Si) or the like into the GaN-based semiconductor to respective desired concentrations.

The resurf layer 48 is formed by ion-implanting silicon (Si) or the like into the GaN-based semiconductor to a predetermined concentration less than that of the ohmic contact layers 46a, 46b, and 47. Note that in FIG. 7, the reference numeral 29B denotes an insulating film.

According to the third embodiment as configured above, similar effects to those of the first embodiment are obtained, and a reliable GaN-based MOSFET is realized while maintaining an advantage of low on-resistance of the GaN-based semiconductor device.

Fourth Embodiment

Figure 8:
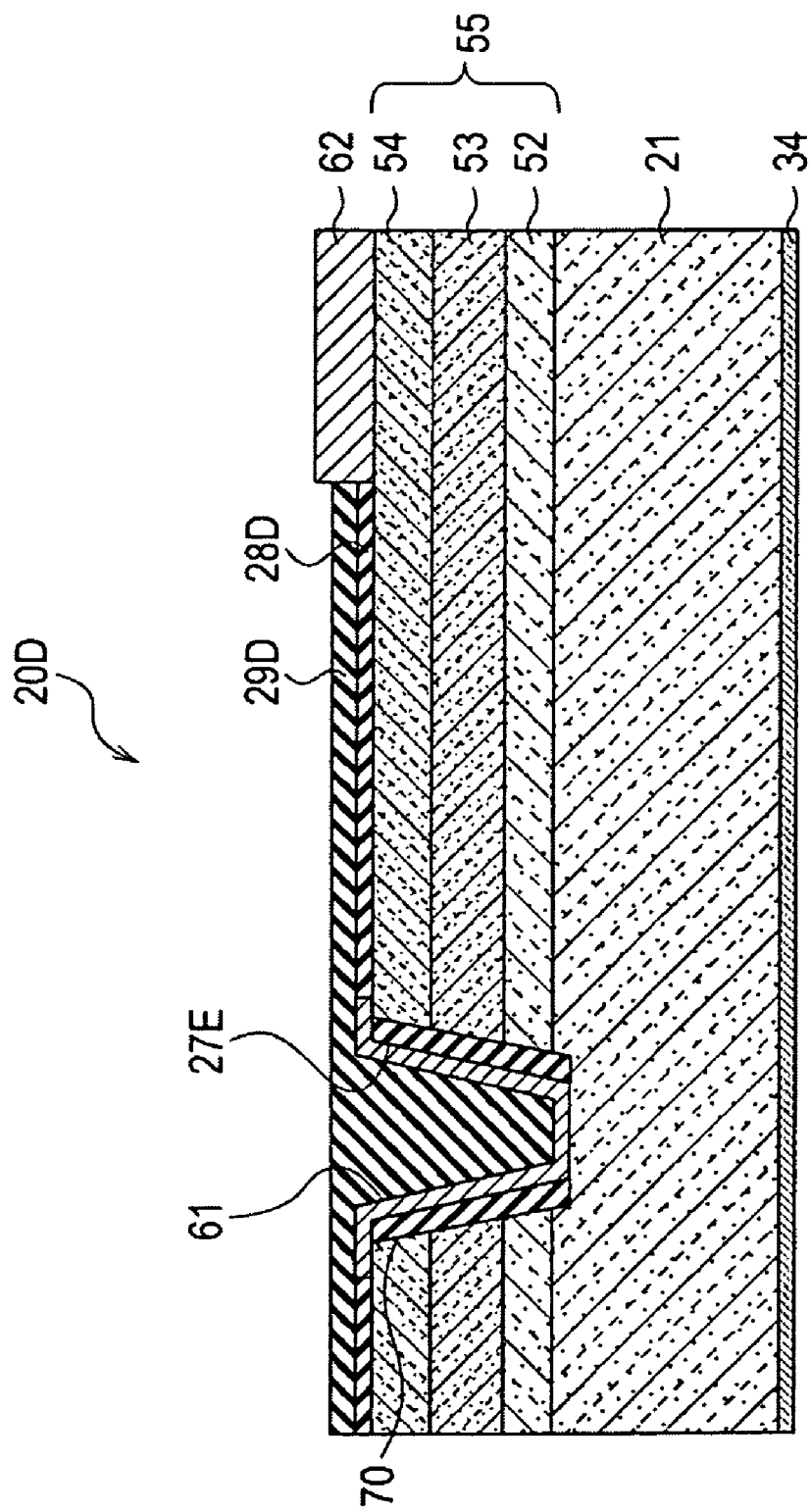
FIG. 8 is a cross sectional view showing a GaN-based semiconductor device according to a fourth embodiment of the present invention.

A GaN-based semiconductor device 20D according to a fourth embodiment is explained below with reference to FIG. 8.

The GaN-based semiconductor device 20D is configured as a GaN-based Schottky barrier diode (GaN-based SBD).

The GaN-based semiconductor device 20D has a p-type silicon substrate 21, an active layer 55 formed of a GaN-based semiconductor on the substrate, a cathode electrode 61 as a first electrode which is in ohmic contact with the active layer 55, and an anode electrode 62 as a second electrode which is in Schottky contact with the active layer 55.

The active layer 55 is composed of, for example, a buffer layer 52 formed of GaN-based semiconductor on the silicon substrate 21, a carrier drift layer 53 formed of undoped GaN on the buffer layer 52, and a carrier supplying layer 54 formed of undoped AlGaN on the carrier drift layer 53.

In the GaN-based semiconductor device 20D, a trench 27E is formed in a portion of the active layer 55 where the cathode electrode 61 is to be formed from a top surface of the active layer 55 to a depth reaching to the silicon substrate 21. In the trench 27E, the cathode electrode 61 which electrically connects the top surface of the active layer 55 and the silicon substrate 21 and an insulating layer 70 which insulates a portion of the cathode electrode 61 on an internal wall surface of the trench 27E from the active layer 55 are formed.

Further, a passivation film 28D is formed on the surface of the carrier supplying layer 54 between the cathode electrode 61 and the anode electrode 62. On the passivation film 28D, an insulating film 29D of silicon nitride (SiN) is formed so as to fill the trench of an inverted trapezoid in cross section of the cathode electrode 61.

According to the fourth embodiment as configured above, similar effects to those of the first embodiment are obtained, and a reliable GaN-based Schottky barrier diode is realized while maintaining an advantage of low on-resistance of the GaN-based semiconductor device.

Fifth Embodiment

Figure 9:
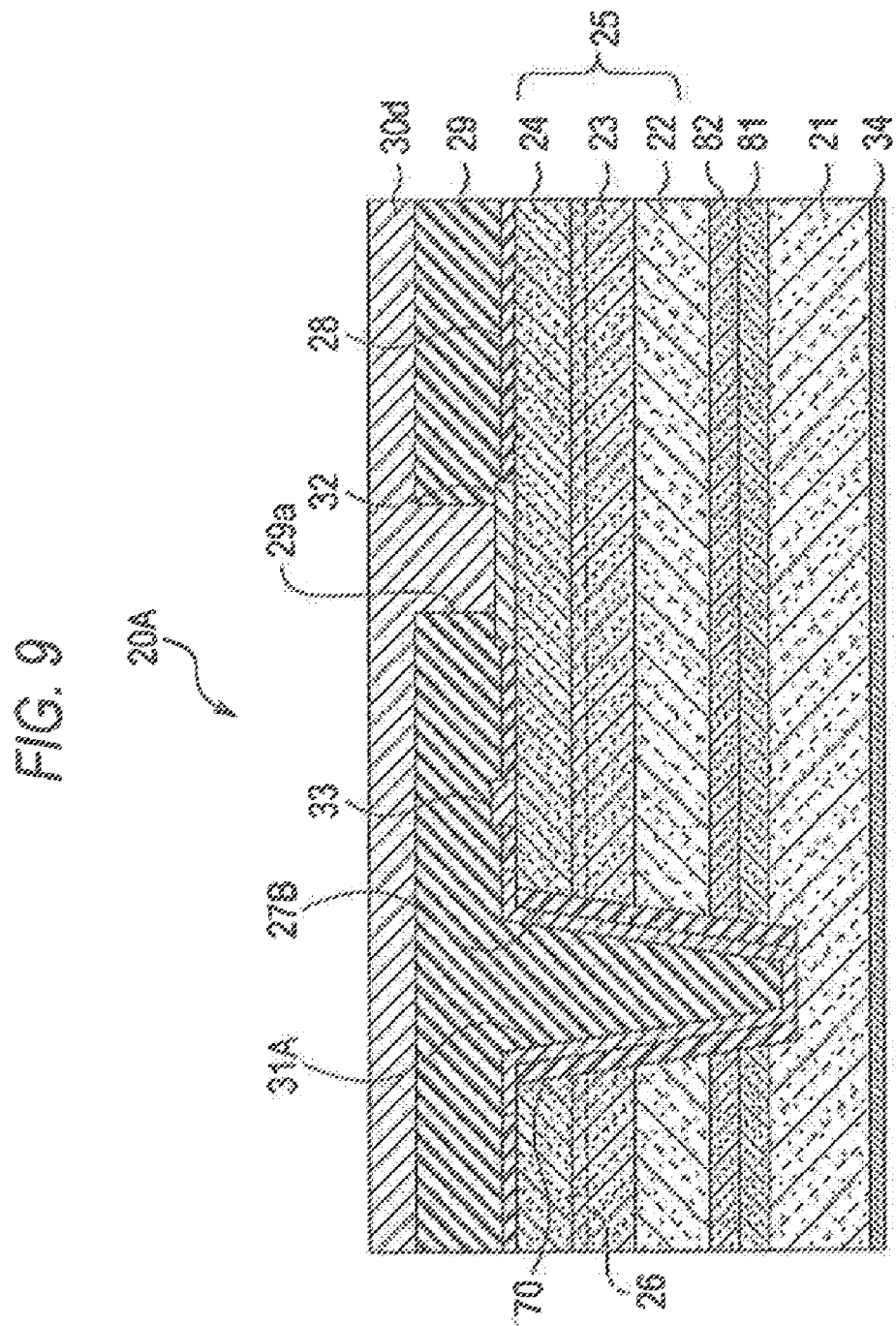
FIG. 9 is a cross sectional view showing a GaN-based semiconductor device according to a fifth embodiment of the present invention.
Figure 10:
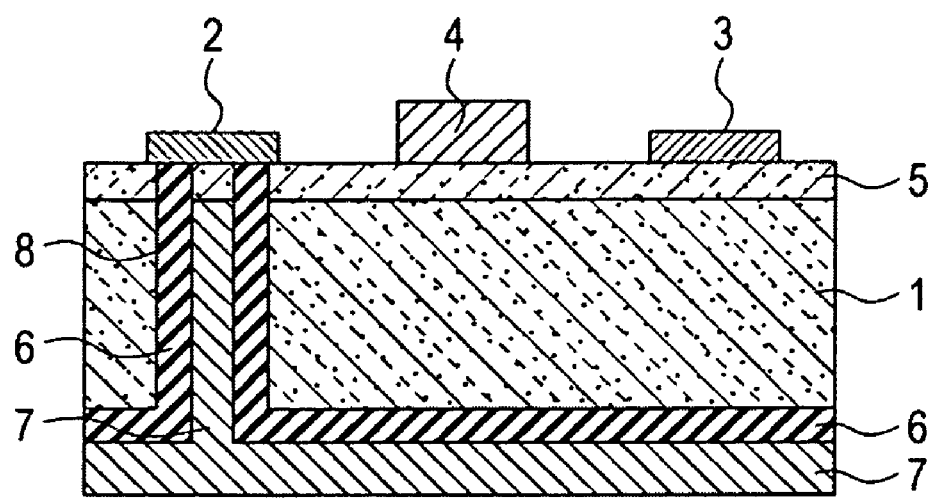
FIG. 10 is a cross sectional view showing a conventional semiconductor device.

A GaN-based semiconductor device 20E according to a fifth embodiment is explained below with reference to FIG. 9.

In the GaN-based semiconductor device 20E, a p-GaN layer 81 and an n-GaN layer 82 are laminated in this order between the silicon substrate 21 and the carrier drift layer (the channel layer) 23 in order to improve a vertical breakdown voltage of the epitaxial wafer.

Figure 6:
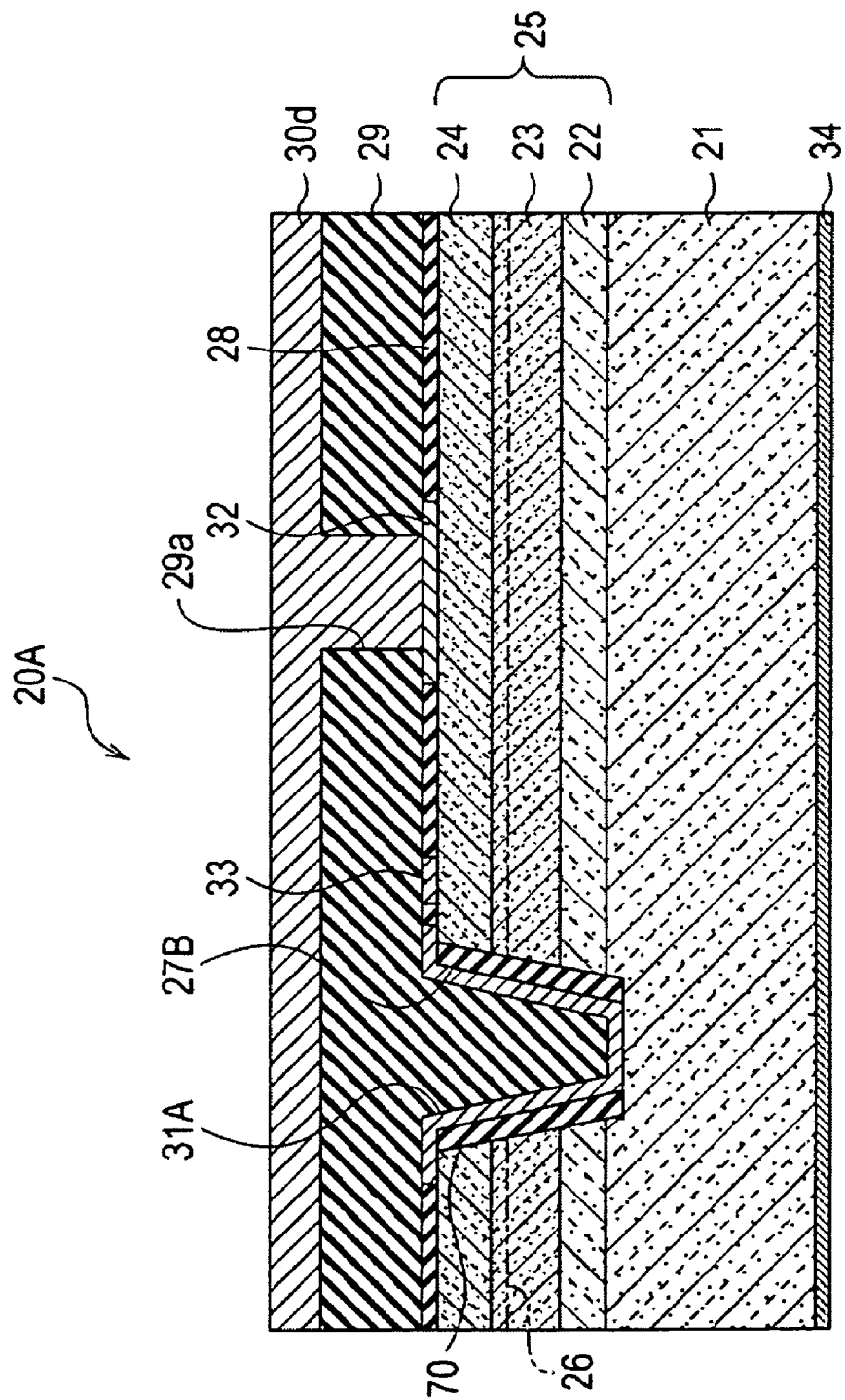
FIG. 6 is a cross sectional view showing a GaN-based semiconductor device according to a second embodiment of the present invention.

In the GaN-based semiconductor device 20E, similarly to the GaN-based semiconductor device 20A shown in FIG. 6, a trench 27B is formed in a portion of the active layer 25 where a source electrode 31A is to be formed.

According to the fifth embodiment as configured above, following effect is obtained in addition to the effects of the first embodiment.

That is, in the GaN-based semiconductor device 20A shown in FIG. 6, it is possible to prevent avalanche breakdown caused by electron injection from the source electrode 31A in the trench 27B into the active layer 25 (i.e., the buffer layer 22) due to the presence of the insulating film 70. However, the vertical breakdown voltage of the epitaxial wafer needs to be improved because a high voltage is applied in the vertical direction of the epitaxial wafer. According to the fifth embodiment, since the p-GaN layer 81 and the n-GaN layer 82 are provided between the silicon substrate 21 and the carrier drift layer 23, a depletion layer extends, and thereby the breakdown voltage of the epitaxial wafer in the vertical direction is improved.

The present invention may be modified in following ways.

Figure 7:
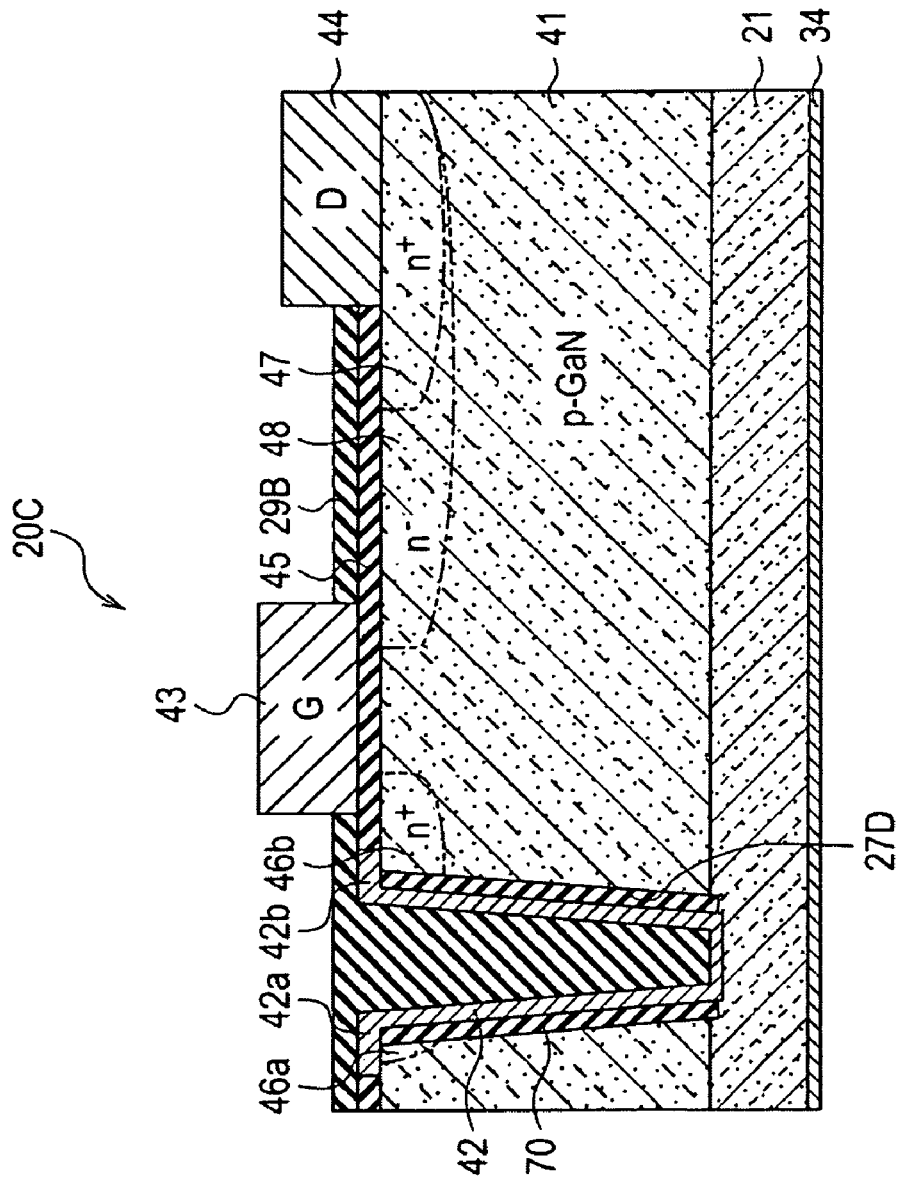
FIG. 7 is a cross sectional view showing a GaN-based semiconductor device according to a third embodiment of the present invention.

(A) In the GaN-based semiconductor device 20C of the third embodiment shown in FIG. 7, the source electrode 42 is formed in the trench 27D which is formed in a portion of the epitaxial layer 41 where the source electrode 42 is to be formed to a depth reaching to the silicon substrate 21, so as to be in electrical contact with both the silicon substrate 21 and the epitaxial layer 41. The present invention, however, is not limited to this configuration. That is, the present invention can be applied to the configuration in which the drain electrode 44 is formed in the trench 27D which is formed in a portion of the epitaxial layer 41 where the drain electrode 44 is to be formed to a depth reaching to the silicon substrate 21, so as to be in electrical contact with both the silicon substrate and the epitaxial layer 41.

(B) The present invention is not limited to the GaN-based semiconductor devices described in the above embodiments. The present invention can be applied to GaN-based semiconductor devices such as MOSFETs, diode bipolar transistors or the like that utilizes a GaN-based semiconductor.

Advantages derived from the present invention may include one or more of the following.

According to one or more embodiment of the present invention, the GaN-based semiconductor device includes: a p-type silicon (Si) substrate; an active layer formed of a GaN-based semiconductor on the substrate; a first electrode and a second electrode between which a current flows via the active layer; and a bottom electrode formed on a bottom surface of the substrate. The first electrode extends on an internal wall surface of a trench formed from a top surface of the active layer to the silicon substrate, from the top surface of the active layer to be in contact with the silicon substrate, and the first electrode is formed of a metal which is in ohmic contact with both the silicon substrate and the active layer.

In this configuration, the current flows from the second electrode to the first electrode via the active layer, and further flows in the first electrode in the vertical direction to reach to the bottom electrode via the p-type silicon substrate. Because the current flows in the first electrode in the vertical direction, a current density in the electrode is reduced, whereby the electro-migration (or a disconnection of electrodes) is prevented and reliability of the device is improved.

Further, since the first electrode is formed of a metal which is in ohmic contact with both the p-type silicon substrate and the active layer, an on-resistance of the device is low, and reliability of the device can be improved while maintaining an advantage of low on-resistance of the GaN-based semiconductor device. Still further, a bonding pad for the first electrode becomes unnecessary, whereby an chip area can be reduced.

According to one or more embodiment of the present invention, the second electrode is electrically connected to a pad which is formed on at least a part of an insulating film formed on the active layer and which extends inside a through hole formed in the insulating film.

In this configuration, the current density in the electrode is further reduced, whereby the electro-migration is further suppressed and reliability is further improved.

According to one or more embodiment of the present invention, the first electrode includes a Ti layer which is in contact with the silicon substrate and the active layer.

In this configuration, it is possible to obtain a good ohmic contact between the first electrode and the silicon substrate or the active layer. Further, since the Ti layer of the first electrode is in contact with the p-type silicon substrate, it is possible to restrain an increase in a resistance (i.e., a contact resistance between the electrode and the semiconductor) when thermally treated.

According to one or more embodiment of the present invention, a thickness of the Ti layer is not less than 15 nm and not greater than 40 nm.

In this configuration, it is possible to obtain a better ohmic contact between the Ti layer and the active layer, thereby the contact resistance between the electrode and the active layer is sufficiently reduced.

According to one or more embodiment of the present invention, a p-type impurity concentration of said p-type silicon substrate is not less than $5 \times 10^{19}$ cm$^{-3}$ and not greater than $1 \times 10^{21}$ cm$^{-3}$.

In this configuration, it is possible to reduce the contact resistance (Rc) between the first electrode and the p-type silicon substrate to less than $10^{-3}$ $\Omega$cm$^{-2}$, for example. By setting the p-type impurity concentration of the p-type silicon substrate to not less than $5 \times 10^{19}$ cm$^{-3}$, the contact resistance is further reduced. By setting the p-type impurity concentration of the p-type silicon substrate to not greater than $1 \times 10^{21}$ cm$^{-3}$, it is possible to prevent a deterioration of crystal quality of the active layer composed of the GaN-based semiconductor.

According to one or more embodiment of the present invention, the GaN-based semiconductor device is a field effect transistor having a source electrode as the first electrode, a drain electrode as the second electrode, and a gate electrode.

In this configuration, a GaN-based field effect transistor of superior reliability is obtained, while maintaining an advantage of low on-resistance of the GaN-based semiconductor device.

According to one or more embodiment of the present invention, the gate electrode is formed via a gate oxide film formed on the active layer.

In this configuration, a GaN-based MOS field effect transistor of superior reliability is obtained, while maintaining an advantage of low on-resistance of the GaN-based semiconductor device.

According to one or more embodiment of the present invention, the active layer includes a first GaN-based semiconductor layer and a second GaN-based semiconductor layer having a larger bandgap energy than the first GaN-based semiconductor layer.

In this configuration, a GaN-based hetero junction field effect transistor of superior reliability is obtained, while maintaining an advantage of low on-resistance of the GaN-based semiconductor device.

According to one or more embodiment of the present invention, the GaN-based semiconductor device is a Schottky barrier diode in which the second electrode is formed of a material which is in Schottky contact with the active layer.

In this configuration, a GaN-based Schottky barrier diode (a GaN-based SBD) of superior reliability is obtained, while maintaining an advantage of low on-resistance of the GaN-based semiconductor device.

According to one or more embodiment of the present invention, an insulating layer is formed on an internal wall surface of the trench, and the first electrode and the active layer are not electrically connected to each other.

In this configuration, a portion of the first electrode in the trench is not in electrical contact with the active layer due to the intervention of the insulating layer. Therefore, it is possible to prevent the avalanche breakdown due to electron injection from the first electrode in the trench into the active layer.

According to one or more embodiment of the present invention, a p-type GaN layer and a n-type GaN layer are laminated in this order between the silicon substrate and the first GaN-based semiconductor layer.

In this configuration, since the p-GaN layer and the n-GaN layer are provided between the silicon substrate and the first GaN-based semiconductor layer, a depletion layer extends, and thereby the breakdown voltage of an epitaxial wafer in the vertical direction is improved.

According to one or more embodiment of the present invention, a method of manufacturing a GaN-based semiconductor device including a p-type silicon (Si) substrate, an active layer formed of a GaN-based semiconductor on the substrate, a first electrode and a second electrode between which a current flows via the active layer, and a bottom electrode formed on a bottom surface of the substrate, the method includes: forming a trench from a top surface of the active layer to a depth reaching to the silicon substrate in a portion of the active layer in which one of the two electrodes is to be formed; forming an insulating film on an entire primary surface, after forming the trench; removing the insulating film by etching the entire primary surface by Reactive Ion Etching (RIE) method except for the insulating film on an internal wall surface of the trench; and forming the one of the two electrodes on an internal wall surface of the insulating film so as to electrically connect the top surface of the active layer and the silicon substrate.

According to one or more embodiment of the present invention, a method of manufacturing a GaN-based semiconductor device including a p-type silicon (Si) substrate, an active layer formed of a GaN-based semiconductor on the substrate, a first electrode and a second electrode between which a current flows via the active layer, and a bottom electrode formed on a bottom surface of the substrate, the method includes: forming an ion implanted high resistance portion by selectively implanting ions in a portion of the active layer in which one of the two electrodes is to be formed; etching the ion implanted portion to a depth reaching to the silicon substrate, leaving an ion implanted layer only on an internal wall surface of a trench formed thereby, to form an insulating film on the internal wall surface of the trench; and forming the one of said two electrodes on the internal wall surface of the insulating film so as to electrically connect the top surface of the active layer and the silicon substrate.

As described above, according to the present invention, it is possible to prevent an occurrence of electro-migration, thereby to realize a GaN-based semiconductor device of improved reliability, while maintaining an advantage of low on-resistance of the GaN-based semiconductor device.

Further, according to the present invention, the number of bonding pads can be reduced and the size of the element is reduced thereby. Still further, it is possible to prevent an occurrence of avalanche breakdown and thereby to realize a GaN-based semiconductor device of improved reliability.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A GaN-based semiconductor device, comprising:
   a silicon substrate;
   an active layer of GaN-based semiconductor formed on the silicon substrate;
   a trench formed in the active layer, the trench extending from a top surface of the active layer to a depth reaching the silicon substrate;
   a first electrode formed on an internal wall surface of the trench, the first electrode extending from the top surface of the active layer to the silicon substrate, the first electrode being formed of metal in direct ohmic contact with both the silicon substrate and the active layer;

a second electrode formed on the active layer to define a current path between the first electrode and the second electrode via the active layer in an on-state of the device; and a bottom electrode formed on a bottom surface of the silicon substrate, the bottom electrode defining a bonding pad for the first electrode, wherein the GaN-based semiconductor device is a field effect transistor further comprising:
a gate electrode;
a source electrode defined by the first electrode; and
a drain electrode defined by the second electrode.

2. The GaN-based semiconductor device according to claim 1, further comprising:
an insulating film formed on the active layer, the insulating film having a through hole; and
a pad electrode formed on a part of the insulating film, the pad electrode extending inside the through hole to be electrically connected to the second electrode, the pad electrode defining a bonding pad for the second electrode.

3. The GaN-based semiconductor device according to claim 1, wherein the first electrode includes a titanium layer in direct ohmic contact with both the silicon substrate and the active layer.

4. The GaN-based semiconductor device according to claim 3, wherein the titanium layer has a thickness of not less than 15 nm and not greater than 40 nm.

5. The GaN-based semiconductor device according to claim 1, wherein the silicon substrate has an impurity concentration of not less than $5\times10^{19}$ cm$^{-3}$ and not greater than $1\times10^{21}$ cm$^{-3}$.

6. The GaN-based semiconductor device according to claim 1, further comprising a gate insulating film formed on the active layer, the gate electrode being formed on the gate insulating film.

7. The GaN-based semiconductor device according to claim 1, wherein the active layer includes a first GaN-based semiconductor layer and a second GaN-based semiconductor layer having a band-gap energy greater than that of the first GaN-based semiconductor layer.

8. The GaN-based semiconductor device according to claim 7, further comprising a p-type GaN layer and an n-type GaN layer laminated in this order between the silicon substrate and the first GaN-based semiconductor layer.

9. The GaN-based semiconductor device according to claim 1, being a Schottky barrier diode, wherein the second electrode is formed of material in Schottky contact with the active layer.

10. The GaN-based semiconductor device according to claim 1, further comprising an insulating layer formed on the internal wall surface of the trench, wherein
the first electrode is formed on the insulating layer, and
the insulating layer electrically insulates the first electrode from the active layer along the internal wall surface.

11. The GaN-based semiconductor device according to claim 10, wherein the insulating layer is made of SiO$_2$.

12. The GaN-based semiconductor device according to claim 10, wherein
the insulating layer is an ion-implanted portion of the active layer, and
the ion-implanted portion has a higher electrical resistance than a remainder of the active layer.

13. The GaN-based semiconductor device according to claim 10, wherein the first electrode has a portion outside the trench, formed on and in ohmic contact with the top surface of the active layer.

14. The GaN-based semiconductor device according to claim 13, wherein
the first electrode has a further portion inside the trench and defining a conductive lining on the internal wall surface of the trench, and
the device further comprises an insulating film fills in a remainder of the trench.

15. The GaN-based semiconductor device according to claim 14, wherein
the insulating film is further formed over the top surface of the active layer, the second electrode and the portion of the first electrode outside the trench, and
the device further comprises a passivation film between the insulating film and the top surface of the active layer.

16. The GaN-based semiconductor device according to claim 13, wherein
the active layer includes on the top surface thereof an ohmic contact region in ohmic contact with the portion of the first electrode outside the trench, and
the ohmic contact region includes an impurity-doped portion of the active layer.

17. The GaN-based semiconductor device according to claim 1, wherein the trench is tapered toward the bottom surface of the substrate.

18. The GaN-based semiconductor device according to claim 1, wherein the first and second electrodes include interdigitating fingers.

19. A GaN-based semiconductor device, comprising:
a silicon substrate;
an active layer of GaN-based semiconductor formed on the silicon substrate;
a trench formed in the active layer, the trench extending from a top surface of the active layer to a depth reaching the silicon substrate;
a first electrode formed on an internal wall surface of the trench, the first electrode extending from the top surface of the active layer to the silicon substrate, the first electrode being formed of metal in direct ohmic contact with both the silicon substrate and the active layer;
a second electrode formed on the active layer to define a current path between the first electrode and the second electrode via the active layer in an on-state of the device; and
a bottom electrode formed on a bottom surface of the silicon substrate, the bottom electrode defining a bonding pad for the first electrode, wherein
the active layer includes a first GaN-based semiconductor layer and a second GaN-based semiconductor layer having a band-gap energy greater than that of the first GaN-based semiconductor layer, and
the GaN-based semiconductor device further comprises a p-type GaN layer and an n-type GaN layer laminated in this order between the silicon substrate and the first GaN-based semiconductor layer.

20. A GaN-based semiconductor device, comprising:
a silicon substrate;
an active layer of GaN-based semiconductor formed on the silicon substrate;
a trench formed in the active layer, the trench extending from a top surface of the active layer to a depth reaching the silicon substrate;
a first electrode formed on an internal wall surface of the trench, the first electrode extending from the top surface of the active layer to the silicon substrate, the first electrode being formed of metal in direct ohmic contact with both the silicon substrate and the active layer;

a second electrode formed on the active layer to define a current path between the first electrode and the second electrode via the active layer in an on-state of the device;

a bottom electrode formed on a bottom surface of the silicon substrate, the bottom electrode defining a bonding pad for the first electrode; and an insulating layer formed on the internal wall surface of the trench, wherein the first electrode is formed on the insulating layer, the insulating layer electrically insulates the first electrode from the active layer along the internal wall surface, the first electrode has a portion outside the trench, formed on and in ohmic contact with the top surface of the active layer, the active layer includes on the top surface thereof an ohmic contact region in ohmic contact with the portion of the first electrode outside the trench, and the ohmic contact region includes an impurity-doped portion of the active layer.

* * * * *